United States Patent
Mages et al.

(10) Patent No.: US 6,736,582 B1
(45) Date of Patent: May 18, 2004

(54) DEVICE FOR MANIPULATING AN OBJECT FOR LOADING AND UNLOADING A CLEAN ROOM

(75) Inventors: Andreas Mages, Jena (DE); Andreas Birkner, Jena (DE); Alfred Schulz, Jena (DE); Klaus Schultz, Jena (DE)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 09/958,504

(22) PCT Filed: Mar. 28, 2000

(86) PCT No.: PCT/US00/08088

§ 371 (c)(1),
(2), (4) Date: Oct. 9, 2001

(87) PCT Pub. No.: WO00/61471

PCT Pub. Date: Oct. 19, 2000

(30) Foreign Application Priority Data

Apr. 9, 1999 (DE) .......................... 199 16 932

(51) Int. Cl.[7] .......................... B65G 49/07; H01L 21/68
(52) U.S. Cl. .................. 414/217; 414/416.11; 414/939; 414/940
(58) Field of Search .............................. 414/217, 217.1, 414/939, 940, 416.11

(56) References Cited

U.S. PATENT DOCUMENTS

| | | | |
|---|---|---|---|
| 4,676,709 A | 6/1987 | Bonora et al. | 414/217 |
| 4,851,018 A | 7/1989 | Lazzari et al. | 55/356 |
| 5,431,600 A | 7/1995 | Murata et al. | 454/187 |
| 5,628,683 A | 5/1997 | Gentischer | 454/187 |
| 5,655,869 A * | 8/1997 | Scheler et al. | 414/940 X |
| 5,752,796 A * | 5/1998 | Muka | 414/217 |
| 5,772,386 A | 6/1998 | Mages et al. | 414/411 |
| 5,810,537 A | 9/1998 | Briner et al. | 414/217 |
| 5,931,631 A | 8/1999 | Bonora et al. | 414/416 |
| 5,934,991 A | 8/1999 | Rush | 454/187 |
| 5,975,825 A | 11/1999 | Blattner et al. | 414/217 |
| 6,364,595 B1 * | 4/2002 | Bonora et al. | 414/416.1 |

FOREIGN PATENT DOCUMENTS

| | | |
|---|---|---|
| DE | 4332657 C2 | 3/1995 |
| DE | 4425208 C2 | 1/1996 |
| DE | 4332657 | * 10/1996 |

* cited by examiner

*Primary Examiner*—Steven A. Bratlie
(74) *Attorney, Agent, or Firm*—Perman & Green, LLP; Richard Pickreign

(57) ABSTRACT

In a device for manipulating an object for loading and unloading a clean room, the problem is to reduce the hardware expense for adjustment devices and for air conditioning while maintaining ergonomic benefits and to further improve the clean room conditions in the device. The device contains a stationary outer part (3) of a housing (2) as well as an inner part (4) that can extend telescopically from it and a receptacle element (11) in the roof area of the inner part (4). For the telescopic extension of the inner part and for the lowering of the receptacle element into the inner part, a common guide rail (16) and a common drive (20) are provided. The receptacle element connected to the drive engages with a driver of the inner part for the telescopic extension of the inner part by vertical upward movement and after reaching an access level (E2, E2), at which the inner part is secured, it can be lowered in the inner part. The inner part is flushed with an air flow coming from the clean room in the region of each level. The device is used for loading and unloading of clean rooms with objects that are transported in a container.

8 Claims, 9 Drawing Sheets

DEVICE FOR MANIPULATING AN OBJECT FOR LOADING AND UNLOADING A CLEAN ROOM

This application claims the benefit of the earlier filed International Application No. PCT/US00/08088, International Filing Date, Mar. 28, 2000, which designated the United States of America, and which international application was published under PCT Article 21(2) in English as WO Publication No. WO 00/61471.

BACKGROUND OF THE INVENTION

The invention concerns a device for manipulating an object for loading and unloading a clean room, with a housing open toward the clean room, consisting of a stationary outer piece and an inner piece which can be telescopically extended from the latter, which contains a receptacle element for the object in its cover zone, which can be adjusted between at least two levels, one above the other, and lowered into the inner piece, while one level is used for ergonomic insertion of the object and the other serves for access to the object when loading and unloading the clean room, and the outer as well as the inner pieces of the housing are provided with air exit openings in the wall of the housing away from the clean room.

Such a device is known, for example, from DE 4,425,208 C2.

In the SMIF boxes preferably used as hoppers for production of semiconductor chips, the manipulating of the wafer hoppers contained in these boxes always requires at first an opening of the boxes before taking out the hoppers and, at the end of the processing step, their return and the closing of the box The technical solution long since known for this calls for the box to be placed on an opening mechanism of a housing, which encloses a local clean room. Box and opening mechanism have mutually adapted closure elements which can be opened one above the other at the same time, so that dust particles lying on the closure elements on the outside are enclosed in between, when the wafer hopper is lowered along with the two closure elements into the enclosure.

Other opening mechanisms for such SMIF boxes lift the hood of the box in order to grant access to the hopper on the inside. The space created around the hopper is surrounded by pieces of the side wall that also move, down to an access opening, in order to prevent particles from entering.

It is known by DE 4,332,657 C2 how to lift and put back the box hood of the SMIF box with a framelike lifting plate of a lifting mechanism. A fixed support plate, on which the bottom of the transport box can be placed, is inserted into the frame opening, which is configured such that it can accommodate the bottom of the transport box.

It is a disadvantage that the displacement flow arrangement described in this patent cannot meet the high demands of a clean room, since the flow of clean air through the zone of the lifting mechanism and air lock is not provided with the effectiveness that is necessary for sufficient removal of particles under heightened clean room requirements. A continual flushing of the spindle is rather unlikely. Since the upward vertical movement of the lifting element causes a displacement of air and associated vortex effects, the clean room conditions are negatively influenced by a largely uncontrolled spread of particles. Thus, particles generated especially in the lower spindle region can be caught up by the vortices and get into the clean room. The overpressure which prevails hardly counteracts this negative effect The slot provided in the location between the two spaces, acting on the spindle in limited manner in time and space, is not able to effectively allow the resulting particles to escape, especially since zones of relative calm arise in the overall region of the lifting mechanism, so that the particles can again settle there.

Furthermore, it may be disadvantageous to always put down the SMIF box at the height of the loading and unloading opening. If the loading and unloading opening is at an unfavorable height, ergonomic working conditions are no longer assured.

On the other hand, a device according to DE 4,425,208 C2 is preferable, by which the removal of the hopper from the SMIF box occurs by lowering the hopper from the opened SMIF box into a mini-lean room. The device is further outfitted with a grip device for moving the hopper around.

The mini-clean room is formed by an inner piece of a housing, which can extend telescopically from an outer stationary piece of the housing and which contains a receptacle element for a loading and unloading device. The receptacle element can move between at least two levels one above the other. At the rear wall away from the clean room, the loading and unloading device is provided with a unit comprising a filter and a blower, and the outer as well as inner piece of the housing are provided with openings.

The air conditioning of this familiar device ensures an active horizontal low-turbulence air flow during the insertion of the workpiece.

Disadvantageous, however, are the relatively high hardware expenses for the active air conditioning, the vertical movement of the receptacle element of the loading and unloading station, and the hopper lowering device.

U.S. Pat. No. 5,810,537 also describes an opening device whereby the box hood can be raised and lowered again by means of a frame. Unlike DE 4,332,657 C2, the opening formed around the hopper when raising the box hood is enclosed by flexible pieces of side wall, preferably in the form of a bellows, which is joined to the frame and the receiving plate for the bottom of the box.

Also disadvantageous here is the not sufficiently solved problem of ensuring the clean room requirements.

The "bag" pulled on forms a space enclosed down to the access opening, which due to the overpressure usually prevailing in the processing system has uncontrolled vortices of air moving through it, so that particles carried along with the air flow settle inside the space bounded by the side walls. This is especially troublesome when the side wall surface is further enlarged by ledges of the bellows.

SUMMARY OF THE EXEMPLARY EMBODIMENTS

The object of the invention is to reduce the hardware expenses for the vertical adjustment of the receptacle element of the loading and unloading station, the lowering device of the hopper, and the air conditioning, while maintaining the ergonomic advantages, and to further improve the clean room conditions in the mini-clean room.

According to the invention, the object is accomplished by a device for manipulating an object for loading and unloading a clean room, with a housing open toward the clean room, consisting of a stationary outer piece and an inner piece which can be telescopically extended from the latter, which contains a receptacle element for the object in its cover zone, which can be adjusted between at least two levels, one above the other, and lowered into the inner piece.

Whereas one level is used for ergonomic insertion of the object and the other serves for access to the object when loading and unloading the clean room. Both the outer as well as the inner piece of the housing are provided with air exit openings in the wall of the housing away from the clean room. For the telescopic extension of the inner piece and for the lowering of the receptacle element into the inner piece, a common guide rail and a common drive for the inner piece and the receptacle element are provided, while the drive is connected to the receptacle element and the receptacle element engages with a driver on the inner piece for the telescopic extension of the inner piece by vertical upward movement, and after reaching a level for access to the object, where a fixation of the inner piece with a locking mechanism occurs, it can be lowered into the inner piece. The inner piece of the housing is arranged in the region of each of the stacked levels with the open side facing the clean room next to at least one air passage opening, which is worked into a wall element provided as an interface with the clean room.

Guide elements are mounted on the guide rail, one of each being secured in a lower region of the inner piece, facing the wall element, and one in the upper region. An additional guide element, arranged on the guide rail between these two guide elements, is connected to the receptacle element, while the guide element secured in the upper region of the inner piece serves as a driver.

It is especially advantageous if the common drive fashioned as a spindle drive contains a tubular protection sheath, which separates the inner piece from a region in which rolling friction is produced by a spindle nut rotating about a spindle.

For air exit from the clean room, besides a loading and unloading opening additional air passageway openings are incorporated into the wall element underneath the loading and unloading opening at the height of the stationary outer piece of the housing.

At the inner piece, shields are provided to close the loading and unloading opening and the additional air passageway openings, while a closing of an opening occurs in the area of a level when the inner piece is arranged next to an opening in the area of the other level.

Advantageously, the receptacle element can move horizontally with a slide guide, which is carried by a holder, which is connected to the guide element of the receptacle element and to the spindle drive.

It is also advantageous for the movement of the receptacle element to be controlled and monitored by means of end position switches.

The invention, making use of an advantageous housing design, provides a mini-clean room that can be adapted with slight technical expense to different working heights and whose clean room conditions, unlike the known technical solutions, are effectively ensured simply by the clean room technology already present in the clean room of the processing station at any given working height The air flow through the mini-clean room occurs in such a way that areas of relative calm are largely eliminated within this space.

BRIEF DESCRIPTION OF THE DRAWINGS

The invention shall now be explained more closely by means of the schematic drawing. This shows.

DETAILED DESCRIPTION

Figure 1:
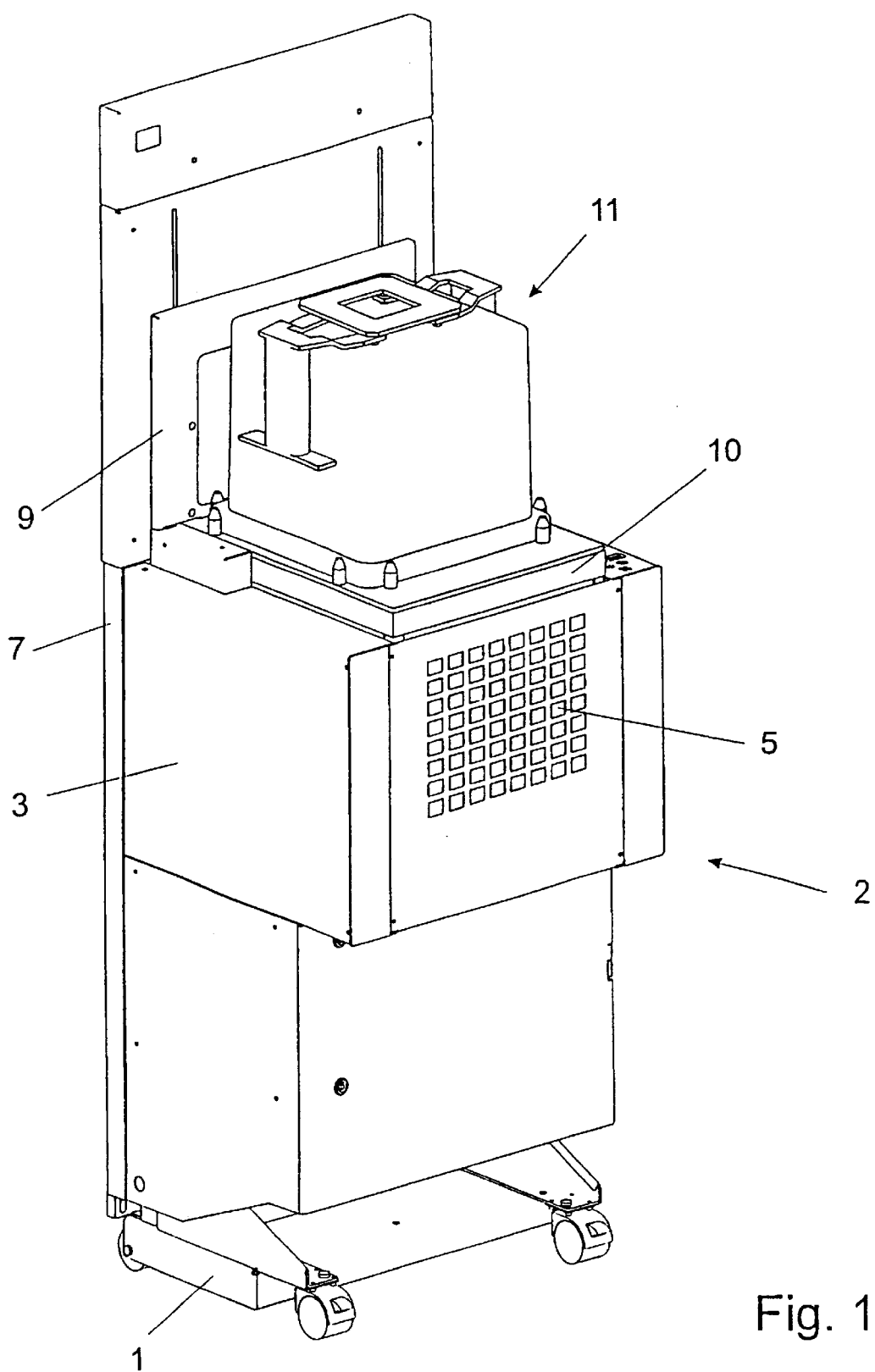
FIG. 1, a perspective view of a manipulating device coupled with a loading and unloading area of a clean room and with retracted inner portion of the housing for ergonomic insertion substrates FIG. 2, a perspective view of the coupled manipulating device with telescopically extended inner part of the housing FIG. 3, a partially sectioned side view of the manipulating device with retracted inner part of the housing FIG. 4, the manipulating device of FIG. 3 with telescopically extended inner part of the housing FIG. 5, the manipulating device with telescopically extended inner part of the housing and with receptacle element lowered and with a hopper located on it FIG. 6, the manipulating device with hopper lowered and moved up to the loading and unloading opening FIG. 7, a perspective view of an adjustment mechanism for the receptacle element in an adjustment condition where the hopper is moved up to the loading and unloading opening FIG. 8, a perspective view of an adjustment mechanism for the receptacle element in an adjustment condition where the hopper can move vertically FIG. 9, a perspective view of the manipulating device as seen from the clean room with retracted inner part of the housing and closed loading and unloading opening FIG. 10, a perspective view of the manipulating device as seen from the clean room with telescopically extended inner part of the housing and opened loading and unloading opening
Figure 2:
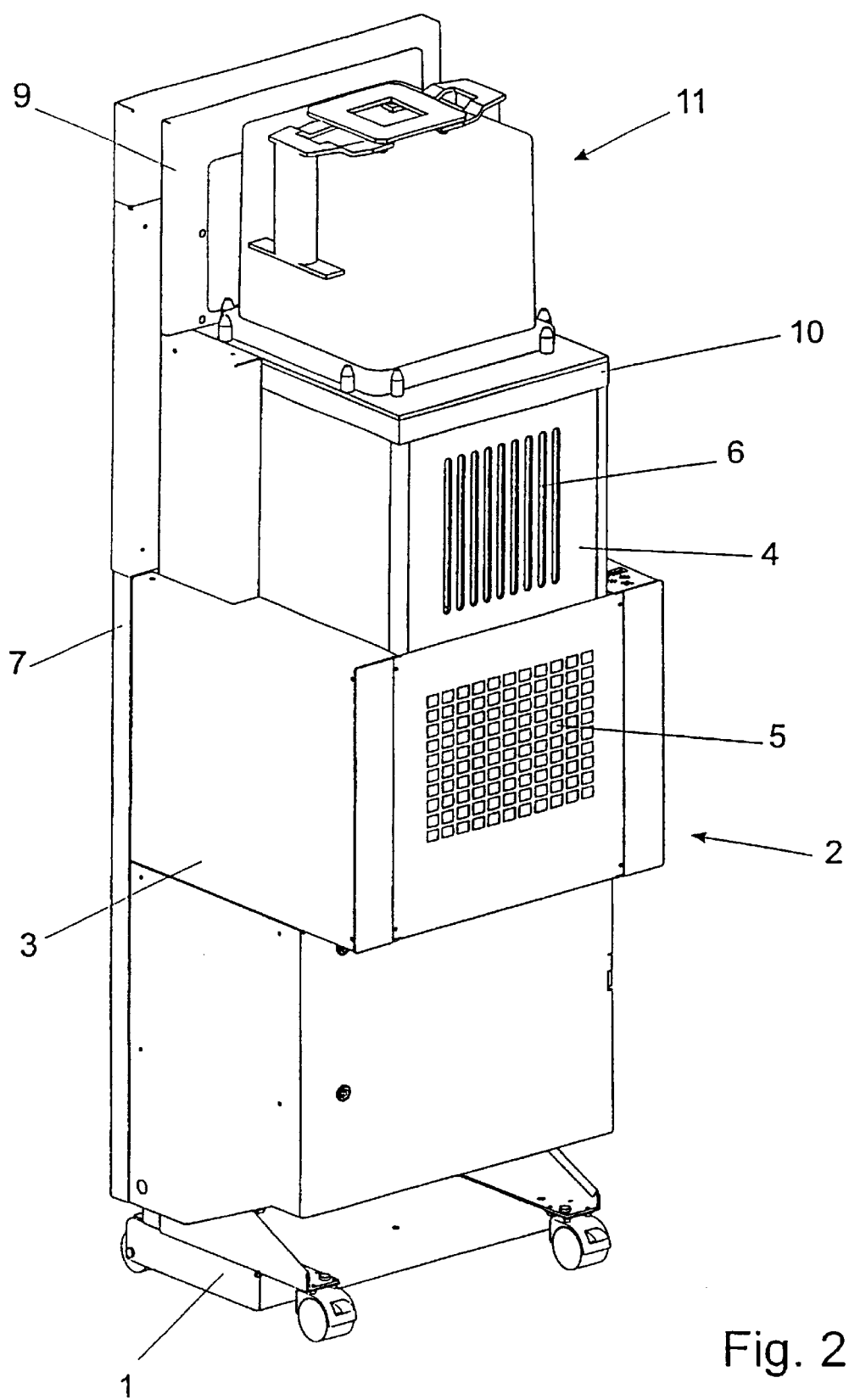
Figure 3:
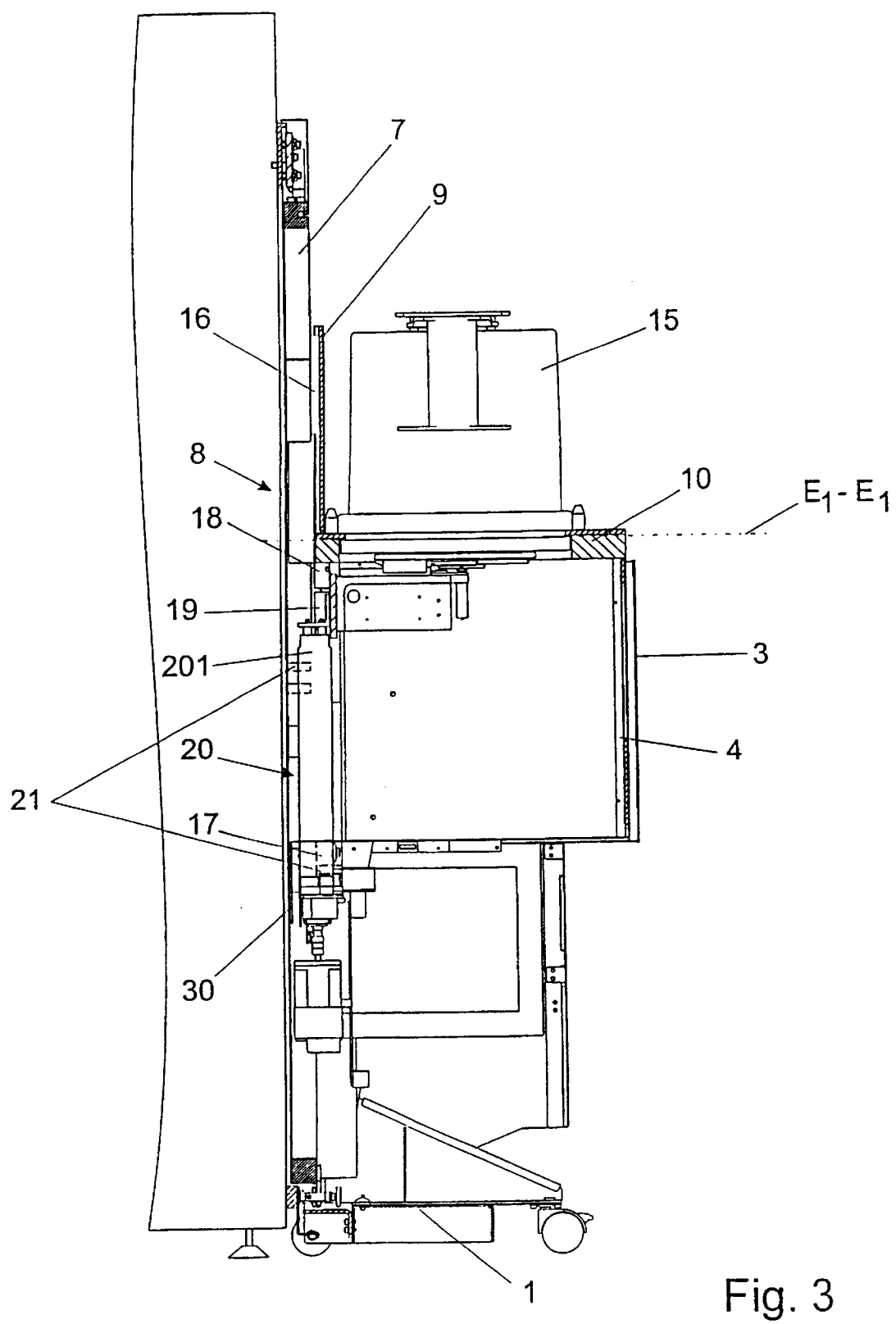

The manipulating device shown in FIGS. 1 through 4 contains a housing 2 on a portable frame 1, in order to ensure an advantageous transport capability, which consists of a stationary outer part 3 and an inner part 4 that can be telescopically extended for loading and unloading a clean room. The inner part 4 encloses a mini-clean room, which is kept clean in that the outer as well as the inner part 4 and 3 of the housing 2 are provided with air exit openings 5, 6 in the wall of the housing away from the clean room. The front side of the housing parts 3 and 4 facing the clean room is totally open and, when connected to the clean room, lies against a wall element 7 provided as an interface, in which a loading and unloading opening 8 is made. At the inner part 4 there is secured a first shield 9, which closes the loading and unloading opening 8 when the inner part 4 is lowered into the outer part 3. In the telescopically extended condition, the shield 9 is also lifted and opens up access to the loading and unloading opening 8.

In the roof of the inner part 4 there is a stowing area for a transport container 11 that is fashioned as a door frame 10 and serves as another interface, which can be ergonomically mounted on it in the form of a SMIF box when the lower part 4 is retracted. A door 12 that is set into the door frame 10 and that can be lowered into the inner part 4 serves as the receptacle element for the object which is to be manipulated by the device. In the present case of using a SMIF box, the object will be a hopper 13 into which substrates, such as semiconductor wafers, are inserted. The door frame 10 and the door 12 are provided in familiar fashion with standardized elements by which the box floor 14 of the SMIF box can be locked and unlocked relative to the box hood 15.

For the telescopic extension of the inner part 4 and for the lowering of the receptacle element into the inner part 4, by which the box floor 14 mounted on the receptacle element is transported from the SMIF box into the mini-clean room along with the hopper 13, there is a common, vertically oriented guide rail 16. Between guide elements 17, 18, which are arranged in the lower and upper region of the inner part 4, respectively, a guide element 19 for the receptacle element is carried by the guide rail 16. In order to create the intended vertical motions, there is a spindle drive 20, whose spindle nut (not shown) is enclosed by a tubular protective shell 201. The tubular protective shell 201, which engages with the receptacle element in order to transmit force, at the same time serves to protect the mini-clean room against particles, since the latter is separated from the region in which rolling friction arises (spindle 202 and spindle nut) during the vertical movements.

Of course, the mini-clean room can also be adapted to working heights other than those represented in this sample embodiment.

Figure 4:
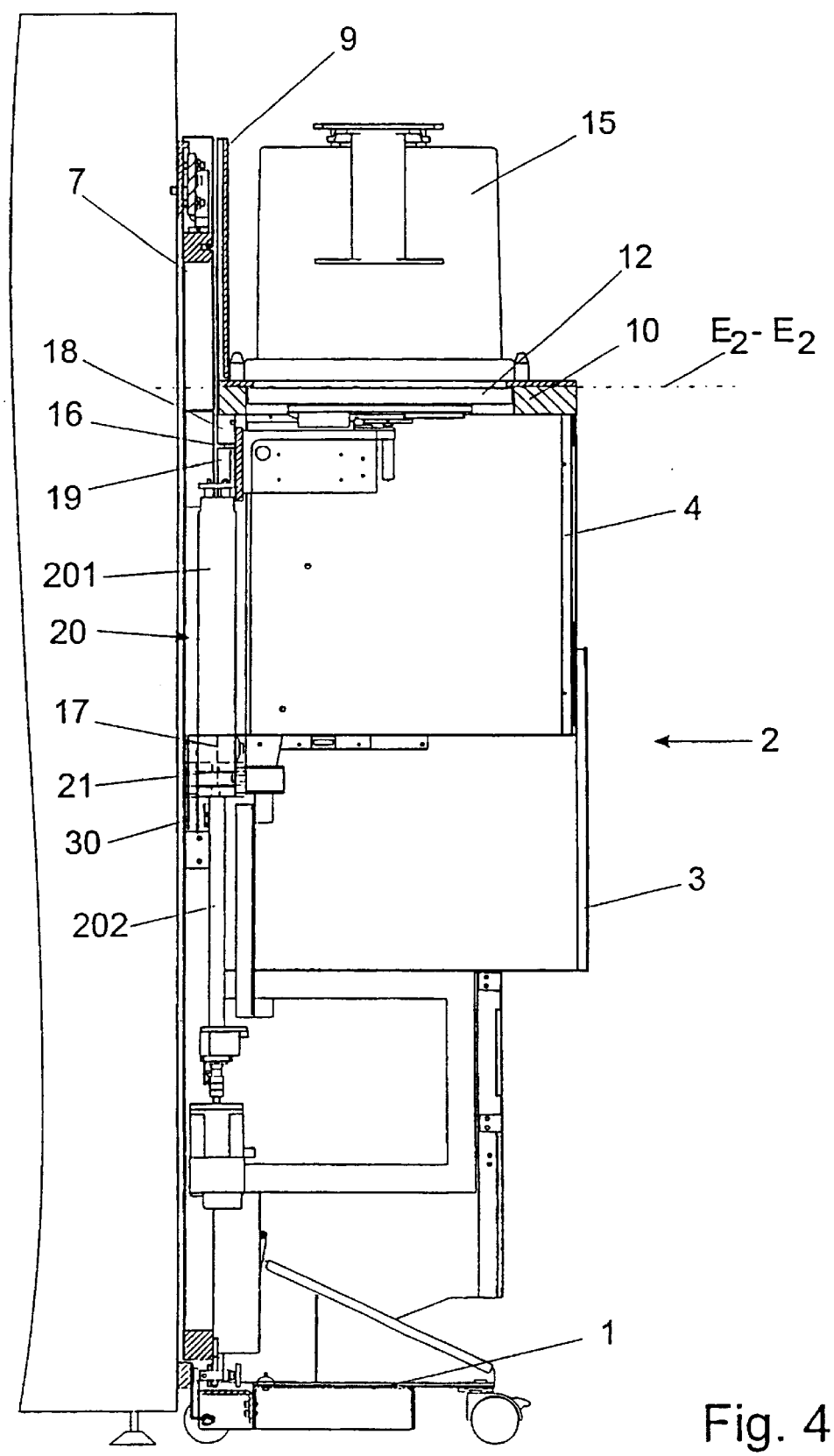
Figure 5:
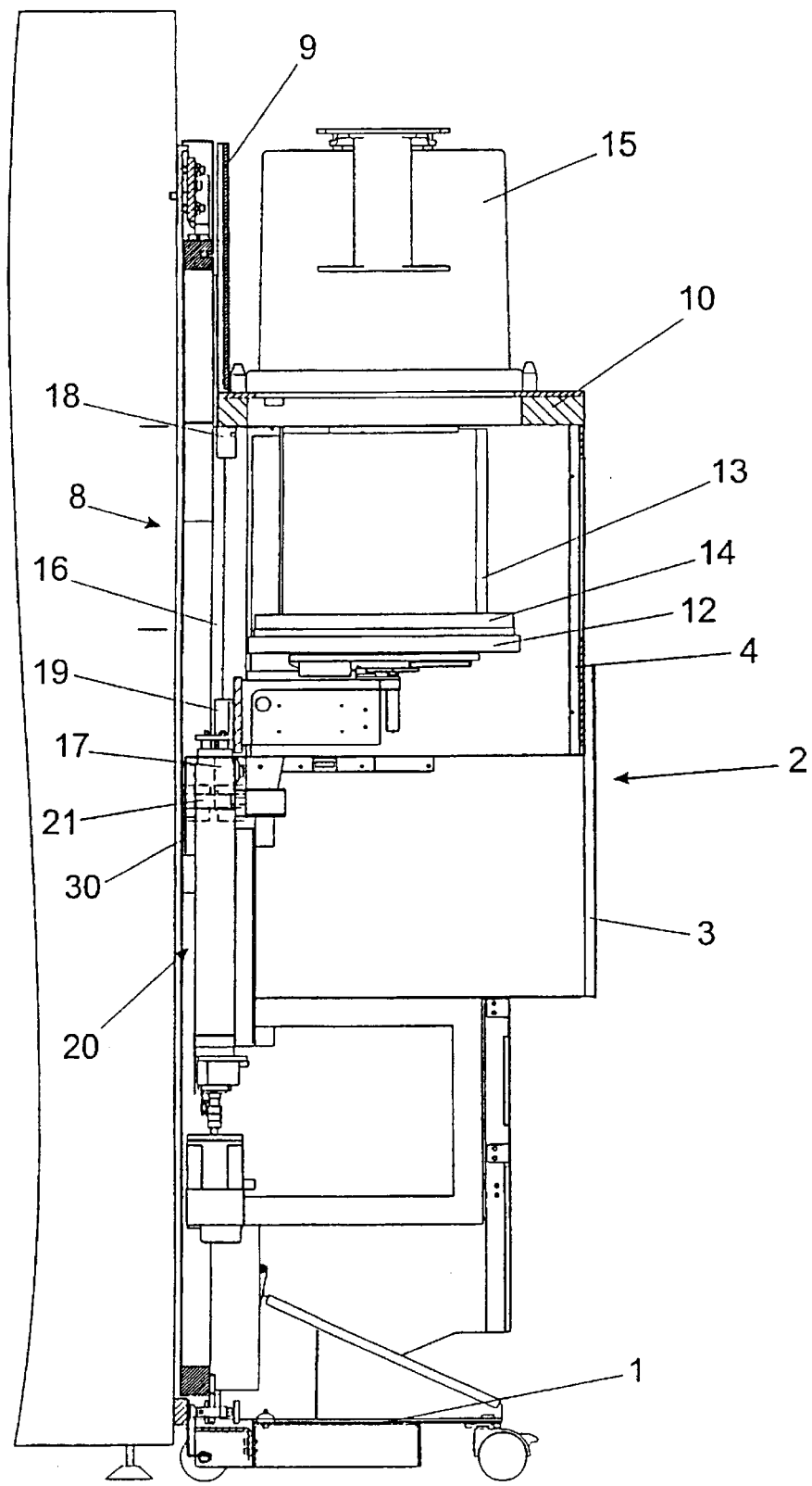

The following functional sequence is specified for the mode of operation of the invention:

In a starting position (FIG. 3), where the inner part 4 is retracted into the outer part 3, so that the receptacle element arranged inside the door frame 10 is situated at an ergonomically advantageous height in a first level $E_1$—$E_1$, a transport container 11 is first brought into the stowing zone and set down there in proper orientation. Next, the inner part 4 is telescopically extended from the outer part 3, while the receptacle element by vertical upward movement with its guide element 19 engages with the upper element 18 of the inner part 4, acting as a driver. The upward movement occurs until the receptacle element has reached a second level $E_2$—$E_2$, from which the hopper 13 can be brought up to the loading and unloading opening 8 by being lowered from the transport container 11. Once the second level $E_2$—$E_2$ is reached, the inner part 4 is secured at this height by means of a locking mechanism 21 (FIG. 4). The spindle drive 20 secured to the receptacle element now produces a vertical downward movement, by which the box floor 14, mounted on the receptacle element, after first being unlocked from the box hood 15, is transported together with the hopper 13 from the SMIF box into the mini-clean room (FIG. 5).

Figure 6:
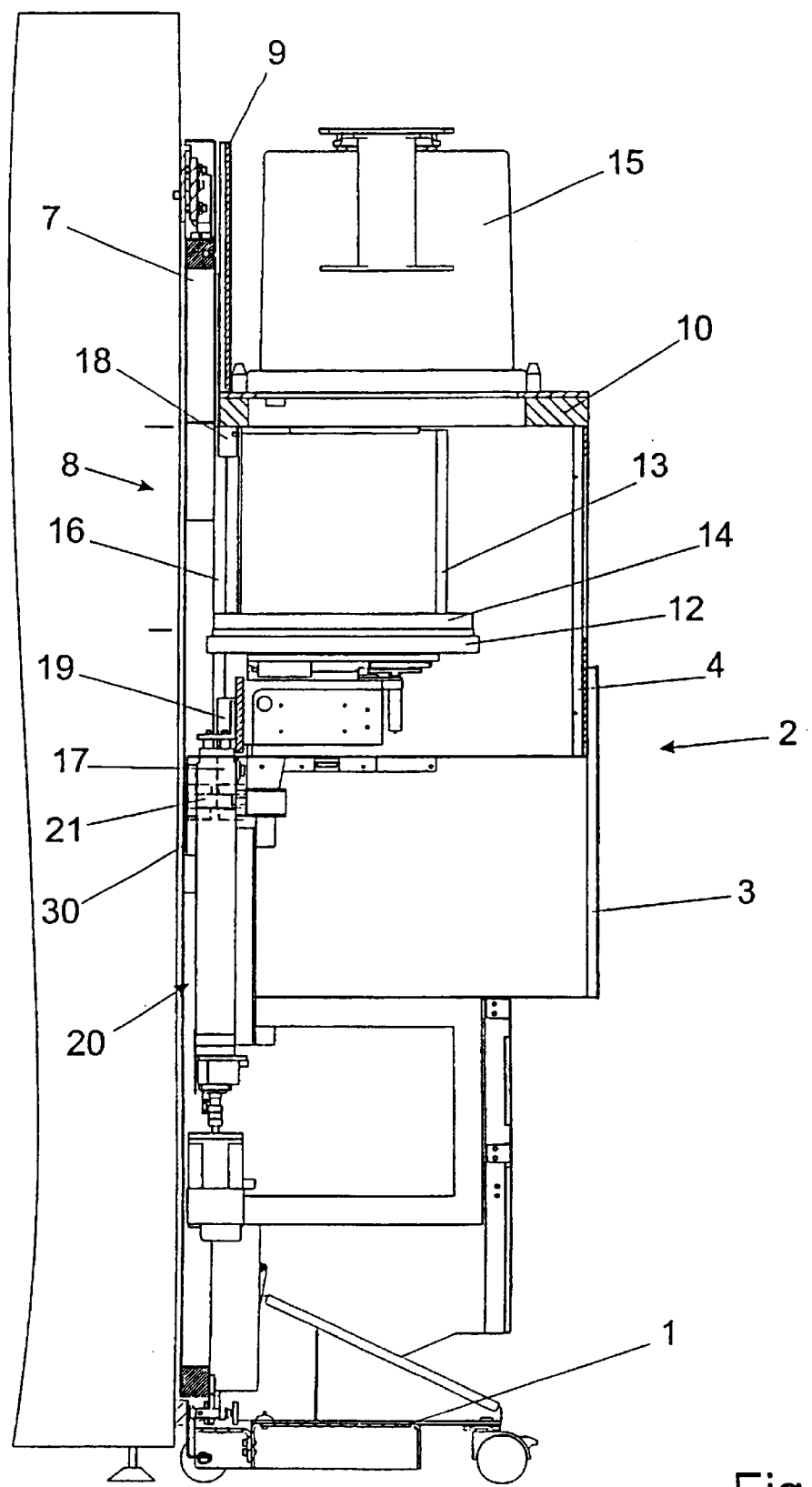
Figure 7:
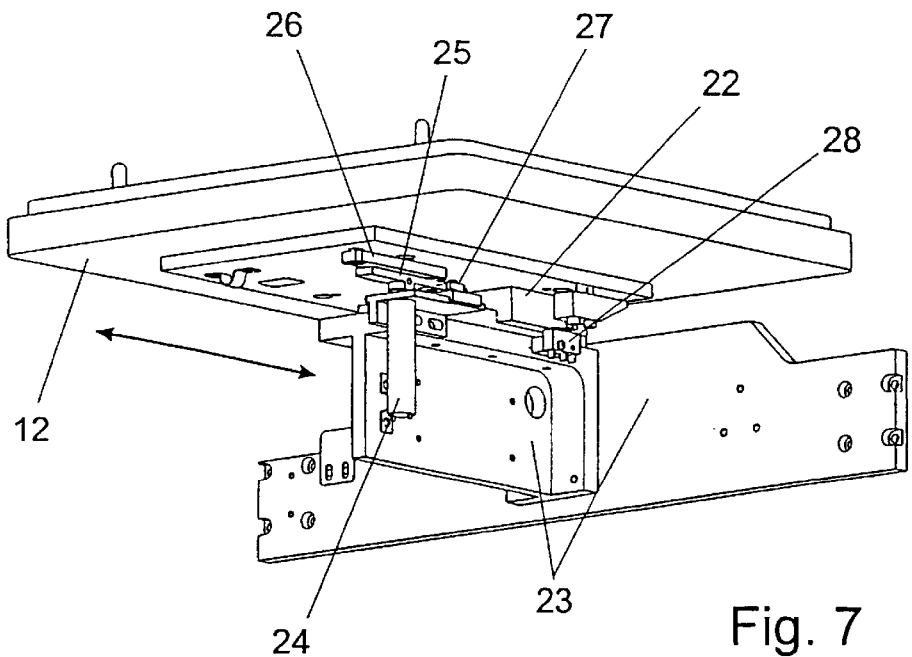
Figure 8:
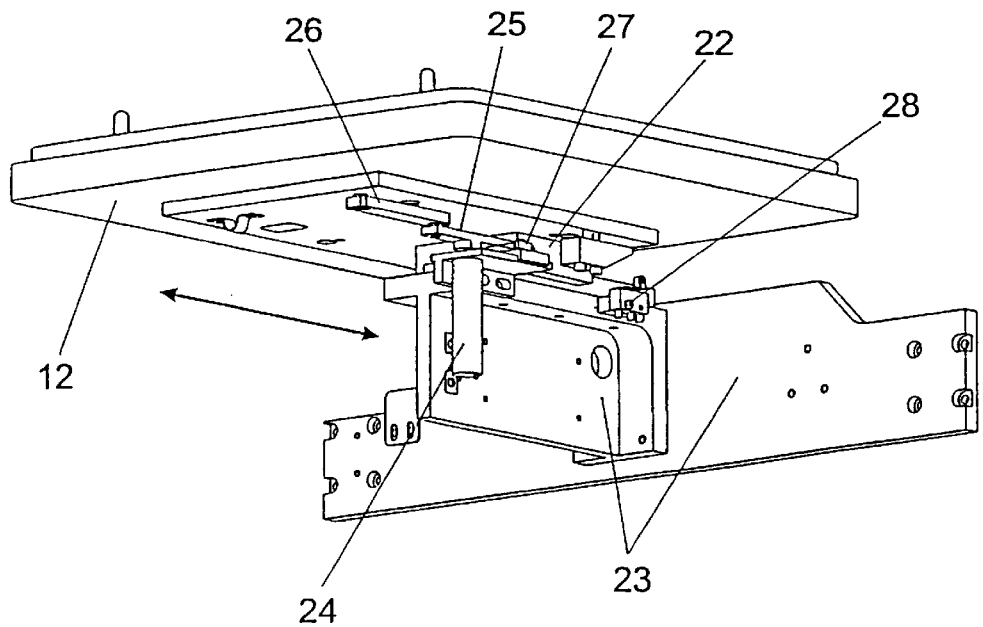

It is often desired to move the hopper 13 closer to the loading and unloading opening 8, as represented in FIG. 6. It may also be desired to move partly or entirely through the loading and unloading opening 8. For this purpose, the receptacle element can be pushed in the proper horizontal direction by means of a slide guide 22 per FIGS. 7 and 8. The slide guide 22 is carried by a holder 23, connected to the guide element 19 and the spindle drive 20, on which a motor 24 is fastened. On the drive shaft of the motor 24 there is a lever 25 with a link 26 hinged to one end of the lever arm, engaging with the bottom of the receptacle element. The turning drive shaft moves the receptacle element on the side by slide by means of the lever 25 and the link 26 in the direction indicated by the arrow along the slide guide 22.

Advantageously, the use of a crank drive facilitates the drive actuation. The two end positions are determined by the dead points of the crank. Under constant speed of the drive, the crank enables a sinusoidal change in the velocity and, thus, an optimal motion sequence. The crank length determines the change in path. To detect the two end positions, there are a first and second end position switch 27, 28. While the first end position switch 27 is activated by one of the lever arms during each half-rotation of the lever 25 and thus signals one of the end positions, the second end position switch 28 is used to distinguish the end positions. Appropriate configuration of the activation element for the end position switch 28 will allow it to signal, besides the end position, also the position from which a vertical movement is possible without danger. One direction of rotation of the drive is sufficient for this configuration.

In another configuration, the end position switches 27, 28 can be assigned specifically to one end position. If the drive is actuated in two directions of turning, one can prevent the particular end position from being reached by shifting the end position switches 27, 28, thus enabling adaptations to the hardware environment.

Figure 9:
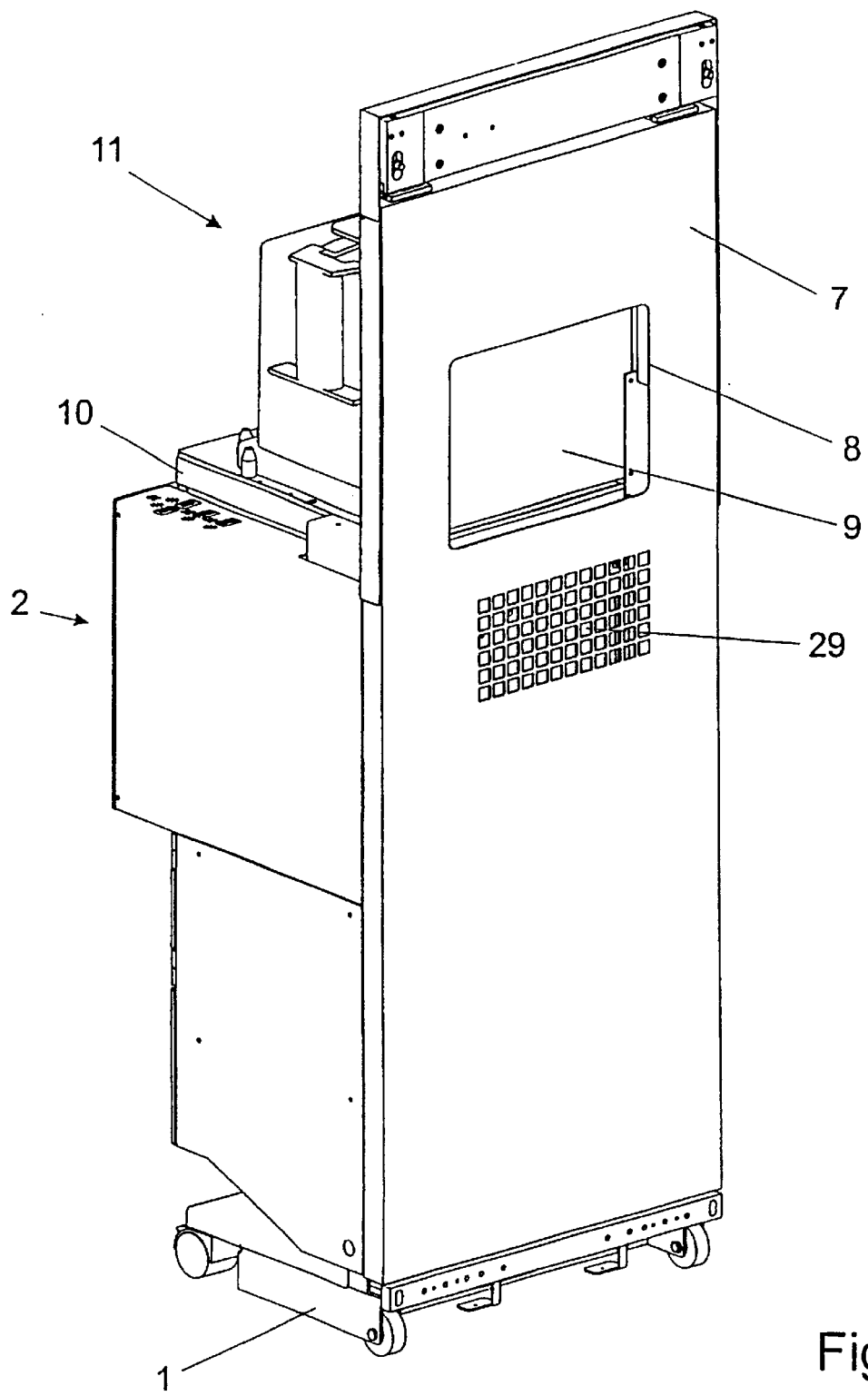
Figure 10:
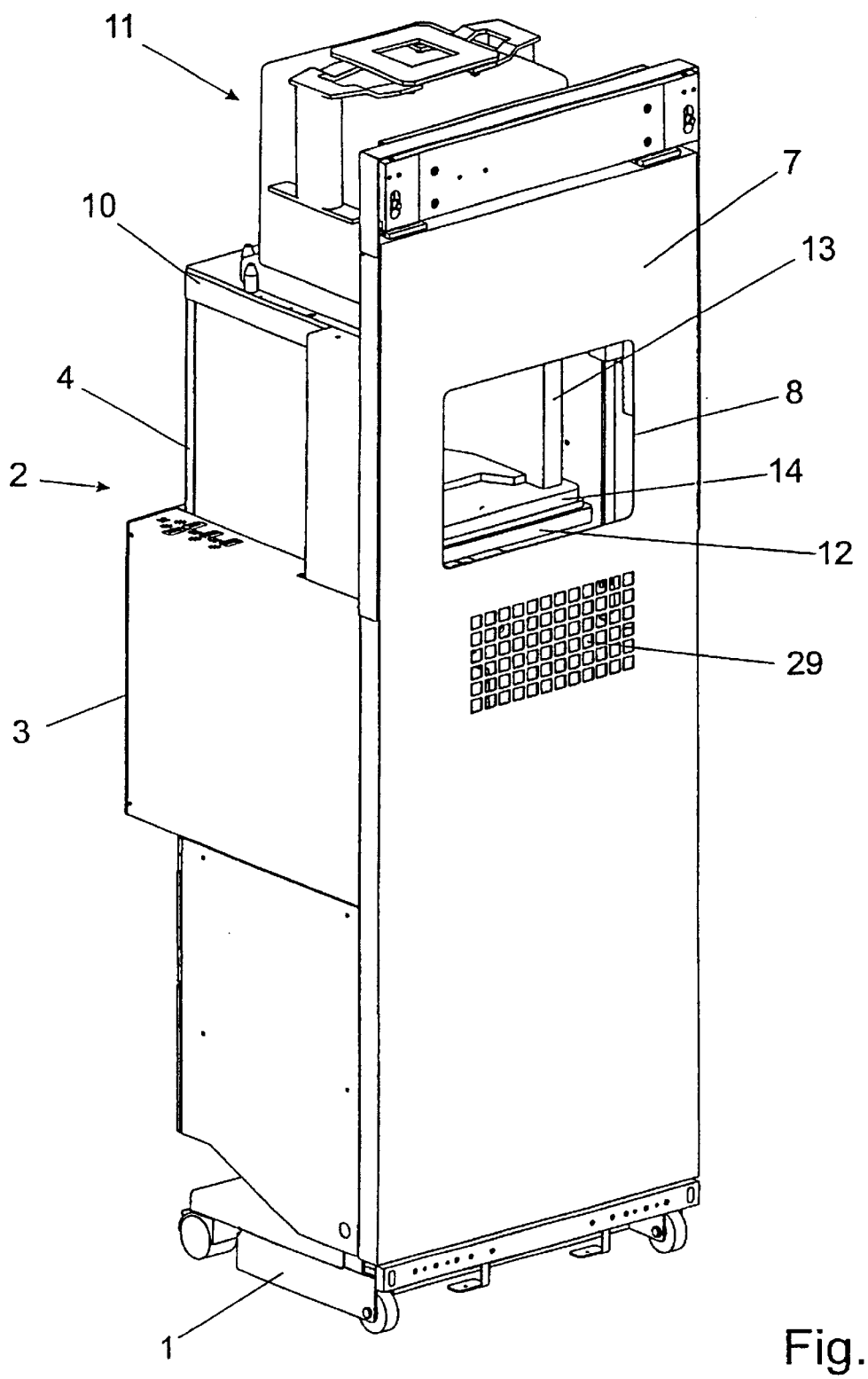

In FIGS. 9 and 10, we find technical details which can substantially improve the clean room conditions inside the mini-clean room without an additional use of active means, such as a filter-fan/blower unit. Beneath the loading and unloading opening 8, which besides enabling the manipulation of objects also serves as an air passage opening, there are additional air passage openings 29 formed in the wall element 7. The flow through the mini-clean room with a low-vortex horizontal air stream is designed such that the inner part 4, both in the retracted lower position and in the telescopically extended condition, is adjacent to air passage openings at the interface with the clean room in the area of each of the stacked levels. If the inner part 4 in the retracted lower position is in front of the air passage openings 29, the loading and unloading opening 8 is closed by the first shield 9, while an air flow entering the housing 2 through the other air passage openings 29 flushes the entire housing 2 in horizontal direction and exits via the openings 5, 6. On the other hand, the air passage openings 29 are closed by a second shield 30, connected to the inner part 4, when the inner part 4 is in the telescopically extended condition. The air flow enters the mini-clean room through the loading and unloading opening 8 and the air flow exits through the openings 6. With such a flow concept, vortices are largely eliminated and a high degree of cleanness is assured with low expense.

What is claimed is:

1. Device for manipulating an object for loading and unloading a clean room, with a housing open toward the clean room, the housing comprising a stationary outer piece and an inner piece which can be telescopically extended from the outer piece, which contains a receptacle element for the object in a cover which can be adjusted between at least two levels one above the other and lowered into the inner piece, and the outer as well as the inner piece of the housing are provided with air exit openings in a wall of the housing away from the clean room, characterized in that for the telescopic extension of the inner piece and for the lowering of the receptacle element into the inner piece, a common guide rail and a common drive for the inner piece and the receptacle element are provided, while the drive is connected to the receptacle element and the receptacle element engages with a driver on the inner piece for the telescopic extension of the inner piece by vertical upward movement, and after reaching one of the two level where a fixation of the inner piece with a locking mechanism occurs, the receptacle element can be lowered into the inner piece, and the inner piece of the housing is arranged in the region of each of the two levels with an open side facing the clean room being next to at least one air passage opening, of the clean room.

2. Device according to claim 1, further characterized in that guide elements are mounted on the guide rail, one of each being secured in a lower region of the inner piece facing the clean room, and one in the upper region, and an additional guide element arranged on the guide rail between the upper and lower guide elements is connected to the receptacle element, while the upper guide element secured to the inner piece serves as a driver.

3. Device according to claim 2, characterized in that the common drive fashioned as a spindle drive contains a tubular protection sheath which separates the inner piece from a region in which rolling friction is produced by a spindle nut rotating about a spindle.

4. Device according to claim 3, characterized in that, for air exit from the clean room, besides a loading and unloading opening additional air passageway openings are incorporated into a wall element of the clean room underneath the loading and unloading opening at the height of the stationary outer piece of the housing.

5. Device according to claim 4, characterized in that at the inner piece shields are provided to alternately close the loading and unloading opening and the additional air passageway openings (29).

6. Device according to claim 5, characterized in that the receptacle element can move horizontally with a slide guide, which is carried by a holder which is connected to the guide element of the receptacle element and to the spindle drive.

7. Device according to claim 6, characterized in that the movement of the receptacle element is controlled and monitored by means of end position switches.

8. A device for loading and unloading an object from a clean room, the device comprising:
- a housing forming a mini-environment and communicably connected to the clean room, the housing having telescoping first and second housing parts;
- a receptacle movably connected to the housing for receiving the object and moving the object from an exterior of the housing into the housing, the receptacle being movable relative the housing between first and second levels;
- a common guide to which the receptacle and at least one of the first or second housing parts are movably joined for telescoping the first and second housing parts and for moving the receptacle relative to the housing; and
- a common drive operably connected to the receptacle and the at least one of the first and second housing parts for moving the receptacle and the at least one of the first and second housing parts;
- wherein at least one of the first and second housing parts has air openings in a wall of the at least one of the first and second housing parts located away from the clean room, and wherein the common guide rail and common drive are located on an opposite side of the housing from the wall.

* * * * *